(12) United States Patent
Siau et al.

(10) Patent No.: US 11,508,444 B2
(45) Date of Patent: Nov. 22, 2022

(54) MEMORY CELL SENSING

(71) Applicant: MICRON TECHNOLOGY, INC., Boise, ID (US)

(72) Inventors: Chang H. Siau, Saratoga, CA (US); Hao T. Nguyen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 17/199,524

(22) Filed: Mar. 12, 2021

(65) Prior Publication Data
US 2022/0208283 A1    Jun. 30, 2022

Related U.S. Application Data

(60) Provisional application No. 63/131,353, filed on Dec. 29, 2020.

(51) Int. Cl.
| | | |
|---|---|---|
| *G11C 16/26* | (2006.01) | |
| *G11C 16/34* | (2006.01) | |
| *G11C 16/04* | (2006.01) | |
| *G11C 16/30* | (2006.01) | |

(52) U.S. Cl.
CPC ...... *G11C 16/3404* (2013.01); *G11C 16/0425* (2013.01); *G11C 16/26* (2013.01); *G11C 16/30* (2013.01)

(58) Field of Classification Search
CPC . G11C 16/3404; G11C 16/0425; G11C 16/26; G11C 16/30
See application file for complete search history.

(56) References Cited

U.S. PATENT DOCUMENTS

| | | |
|---|---|---|
| 9,396,791 B2 | 7/2016 | Raghunathan et al. |
| 10,741,252 B2 | 8/2020 | Lee |
| 2013/0107623 A1 | 5/2013 | Kavalipurapu et al. |
| 2020/0202950 A1 | 6/2020 | Moschiano et al. |
| 2021/0174880 A1* | 6/2021 | Liang ............. G11C 16/32 |
| 2021/0193230 A1* | 6/2021 | Chen ............. G11C 16/32 |

* cited by examiner

*Primary Examiner* — Xiaochun L Chen
(74) *Attorney, Agent, or Firm* — Dicke, Billig & Czaja, PLLC

(57) ABSTRACT

Sensing devices might include a first voltage node configured to receive a first voltage level, a second voltage node configured to receive a second voltage level lower than the first voltage level, a p-type field-effect transistor (pFET) selectively connected to a data line, and a sense node selectively connected to the pFET. The pFET might be connected between the first voltage node and the data line, between the second voltage node and the data line, and between the first voltage node and the data line. Memories might have controllers configured to cause the memories to determine whether a memory cell has an intended threshold voltage using similar sensing devices.

26 Claims, 10 Drawing Sheets

MEMORY CELL SENSING

RELATED APPLICATION

This application claims the benefit of U.S. Provisional Patent Application Ser. No. 63/131,353, filed Dec. 29, 2020 and titled, "MEMORY CELL SENSING," which is commonly assigned and incorporated by reference herein in its entirety.

TECHNICAL FIELD

The present disclosure relates generally to integrated circuits, and, in particular, in one or more embodiments, the present disclosure relates to apparatus and methods for sensing of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Programming memory cells typically utilizes an iterative process of applying a programming pulse to a memory cell and verifying if that memory cell has reached its desired data state in response to that programming pulse, and repeating that iterative process until that memory cell passes the verification. Before each programming pulse, word lines might be precharged, and after each programming pulse, the word lines might be discharged. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation. Given the iterative nature of programming operations, and the relatively high voltage levels each iteration uses, programming operations can be significant influences on both the speed and power consumption of a memory.

Sensing (e.g., reading or verifying) a data state of a memory cell often involves detecting whether the memory cell is activated in response to a particular voltage applied to its control gate, such as by detecting a change in voltage level of a node connected to the memory cell caused by current flow through the memory cell. As a desire for higher storage density memory cells grows, verify operations can adversely impact the time needed to program the memory cells as more data states might need to be verified between each programming pulse.

DETAILED DESCRIPTION

Figure 1:
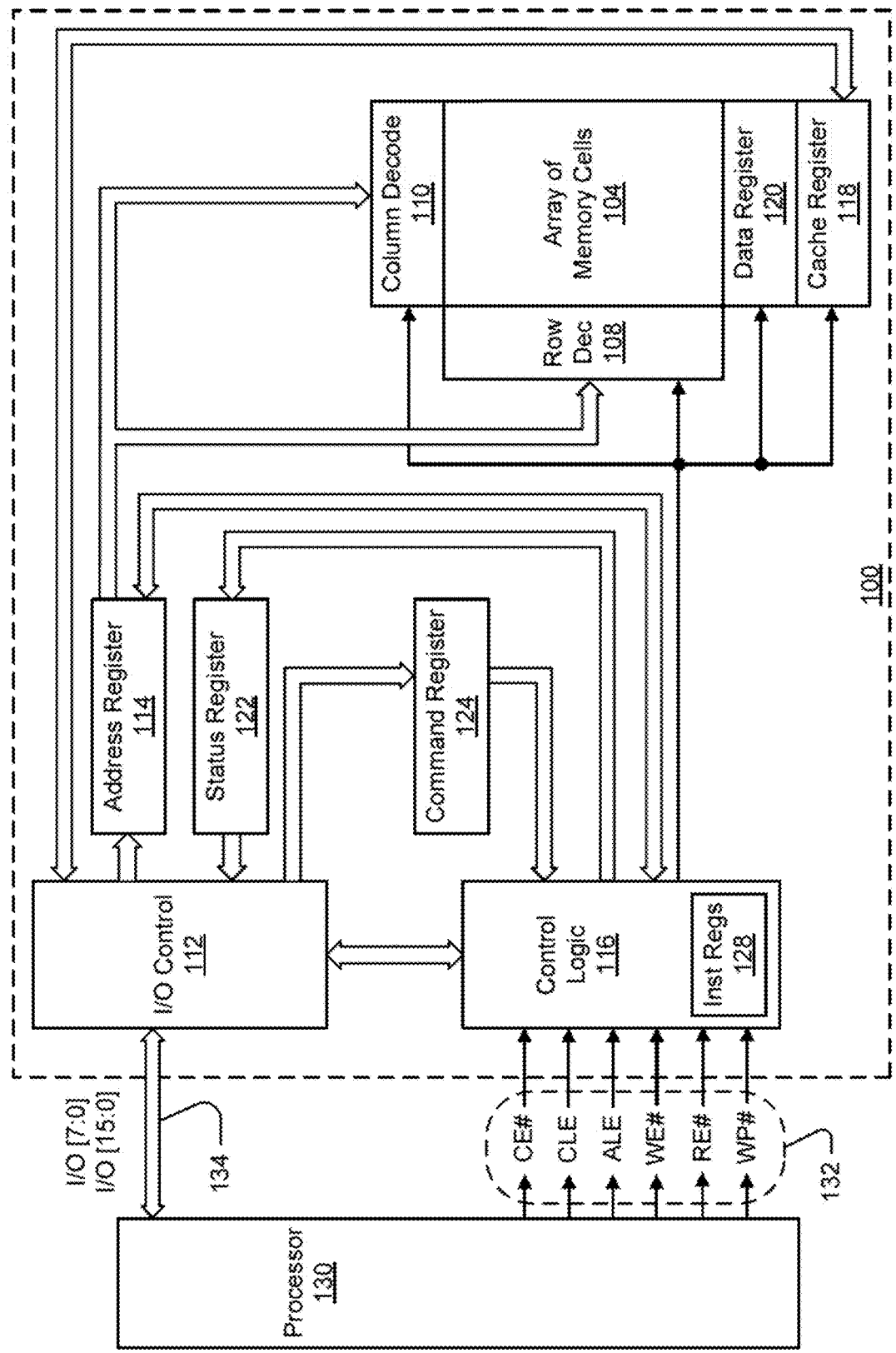
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sense operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/ output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
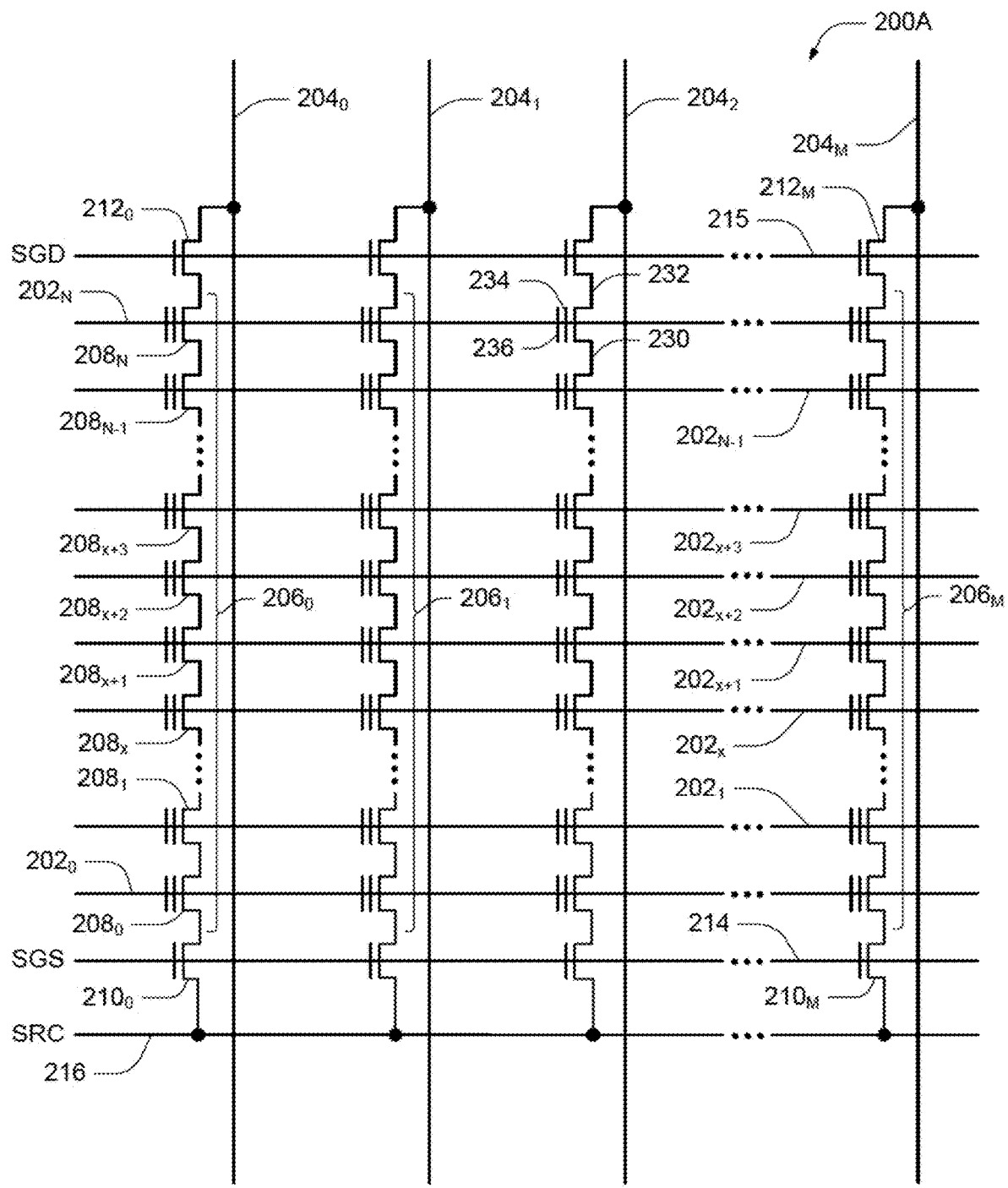
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The source 216 might represent a voltage node commonly selectively connected to the memory cells 208 of a plurality of NAND strings 206. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
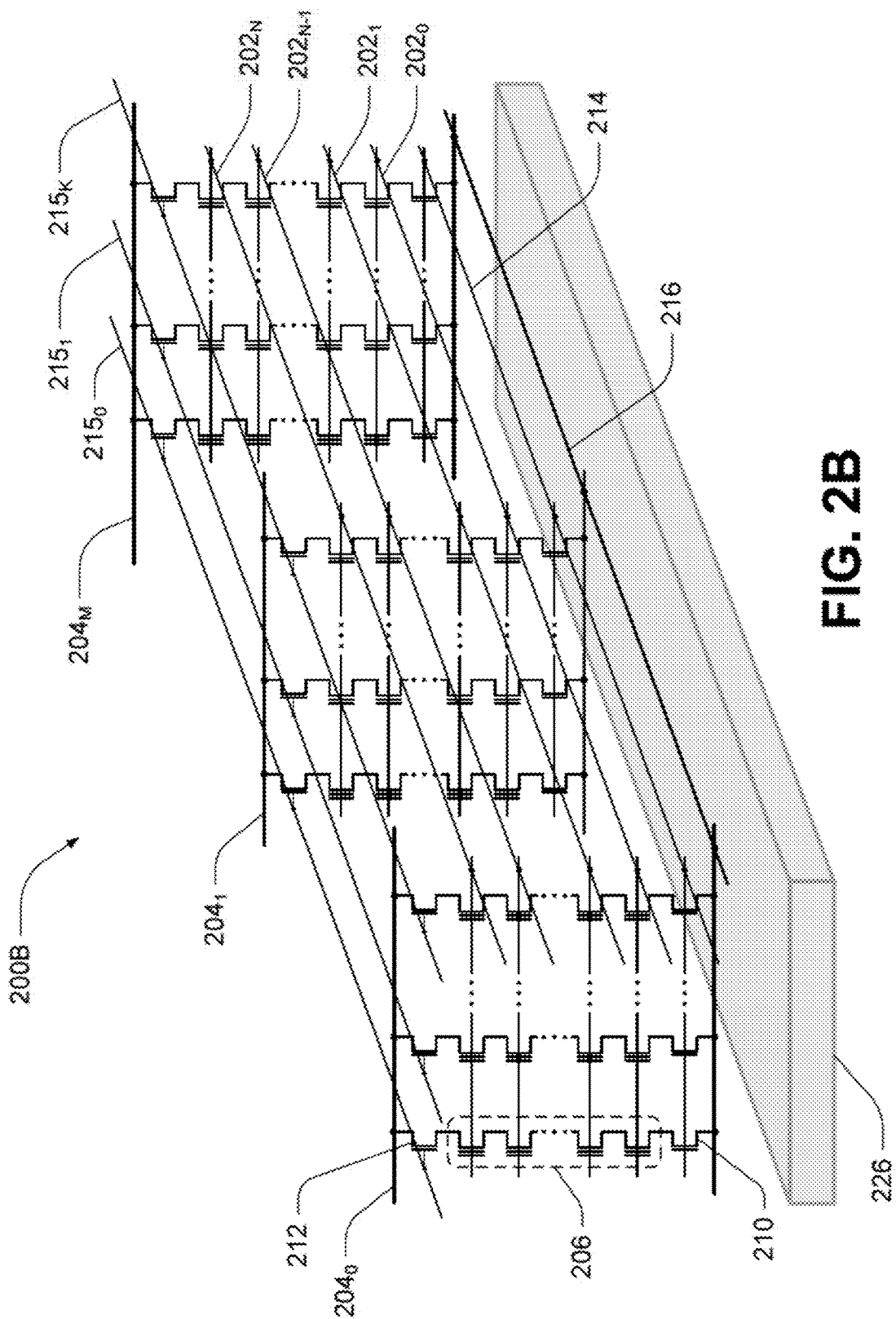

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
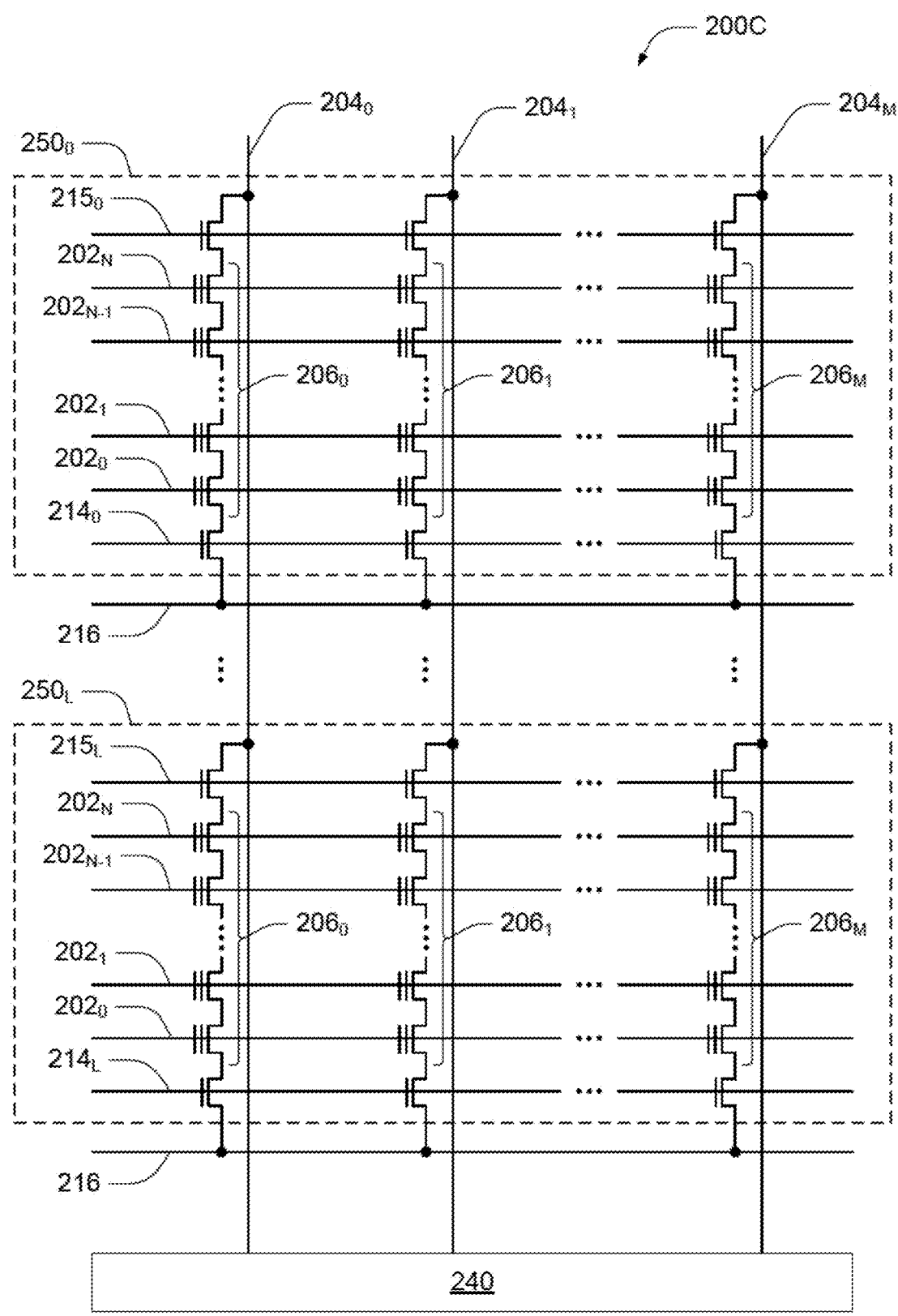

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sensing devices (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3:
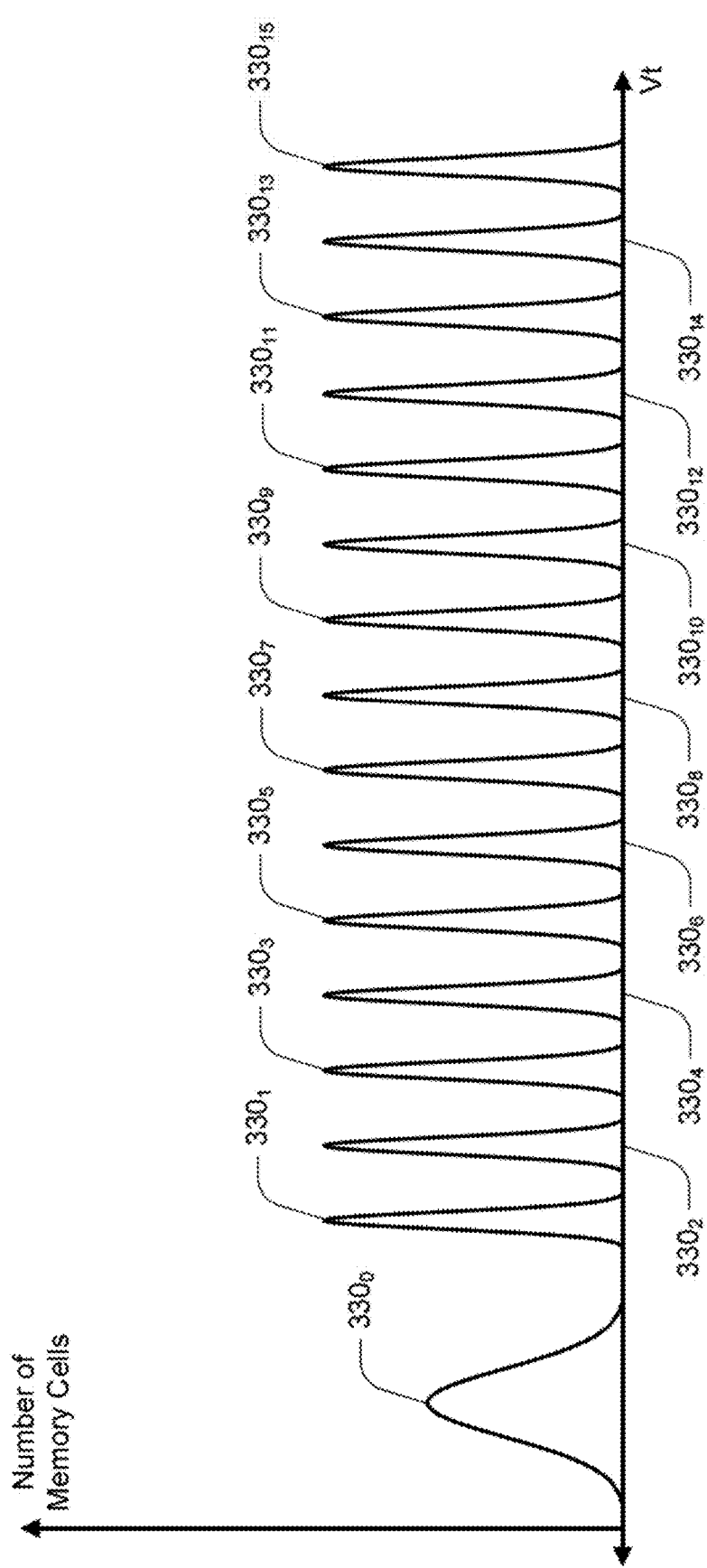
FIG. 3 is a conceptual depiction of threshold voltage distributions of a plurality of memory cells.

FIG. 3 is a conceptual depiction of threshold voltage ranges of a plurality of memory cells. FIG. 3 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ may tend to have tighter distributions.

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$ and $330_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case may be storing a data state L0 having a data value of logical '1111' and is typically referred to as the erased state of the memory cell. If the threshold voltage is within the second of the sixteen threshold voltage ranges $330_1$, the memory cell in this case may be storing a data state L1 having a data value of logical '0111'. If the threshold voltage is within the third of the sixteen threshold voltage ranges $330_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 1 might be contained within the trim register 128, for example.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

As memory cells are reduced in size, their associated data storage structures generally become smaller. In addition, as more levels of data states are stored to memory cells, differentiation between data states may become more difficult. Mitigating widening of the threshold voltage distributions thus may become more important.

To improve programming speeds, verify operations between programming pulses might be performed concurrently for more than one data state while a single voltage level is applied to the control gates of the memory cells selected for a sense operation, e.g., a verify operation in this case. As used herein, a first act and a second act occur concurrently when the first act occurs simultaneously with the second act for at least a portion of a duration of the second act. Sensing devices typically determine a memory cell to be activated or deactivated in response to a current flow from the data line through the memory cell to a common source. To concurrently sense for one data state in one memory cell and a different data state in another memory cell while each receives the same gate voltage, the cell current of both memory cells might generally have to be similar when using sensing devices of similar configuration.

Cell current is generally dependent upon the gate-to-source voltage differential, Vgs, and the drain-to-source voltage differential, Vds. With NAND arrays having memory cells sharing a common source, and sensing schemes discharging the data line to the common source, there is no degree of freedom in altering Vgs. As such, generating similar cell currents might require altering the Vds. For example, the memory cell having the lower expected threshold voltage might receive a lower Vds than the memory cell having the higher expected threshold voltage. This can be accomplished by altering the voltage level of the data lines of the different memory cells during the verify operation. For example, a data line for sensing the L1 data state of a memory cell might be biased at 0.4V, while a data line for sensing the L2 data state of a different memory cell might be biased at 0.8V. However, during a read operation, a data line might be biased at 0.6V to distinguish between the L1 and L2 data states. This can create a program verify-to-read mismatch, leading to a widening of the threshold voltage distributions over techniques that verify each data state individually. Such widening is generally highly dependent upon the Vds delta between the data lines, and is generally a logarithmic relationship.

Various embodiments seek to mitigate the widening of threshold voltage distributions of concurrent verify operations while facilitating reductions in programming time. Various embodiments reverse the flow of current as compared to typical NAND sensing schemes by using the common source as the higher-voltage node, and the sensing device as the lower-voltage node. In this manner, variation of both Vgs and Vds can be provided at the same gate voltage. Because variation of the data line voltage effects changes in both Vgs and Vds, smaller levels of Vds delta can be used to generate similar cell currents. The smaller levels of Vds deltas made available in this manner might provide for exponential reductions in threshold voltage distribution widening over techniques relying on changes in Vds alone.

Figure 4A:
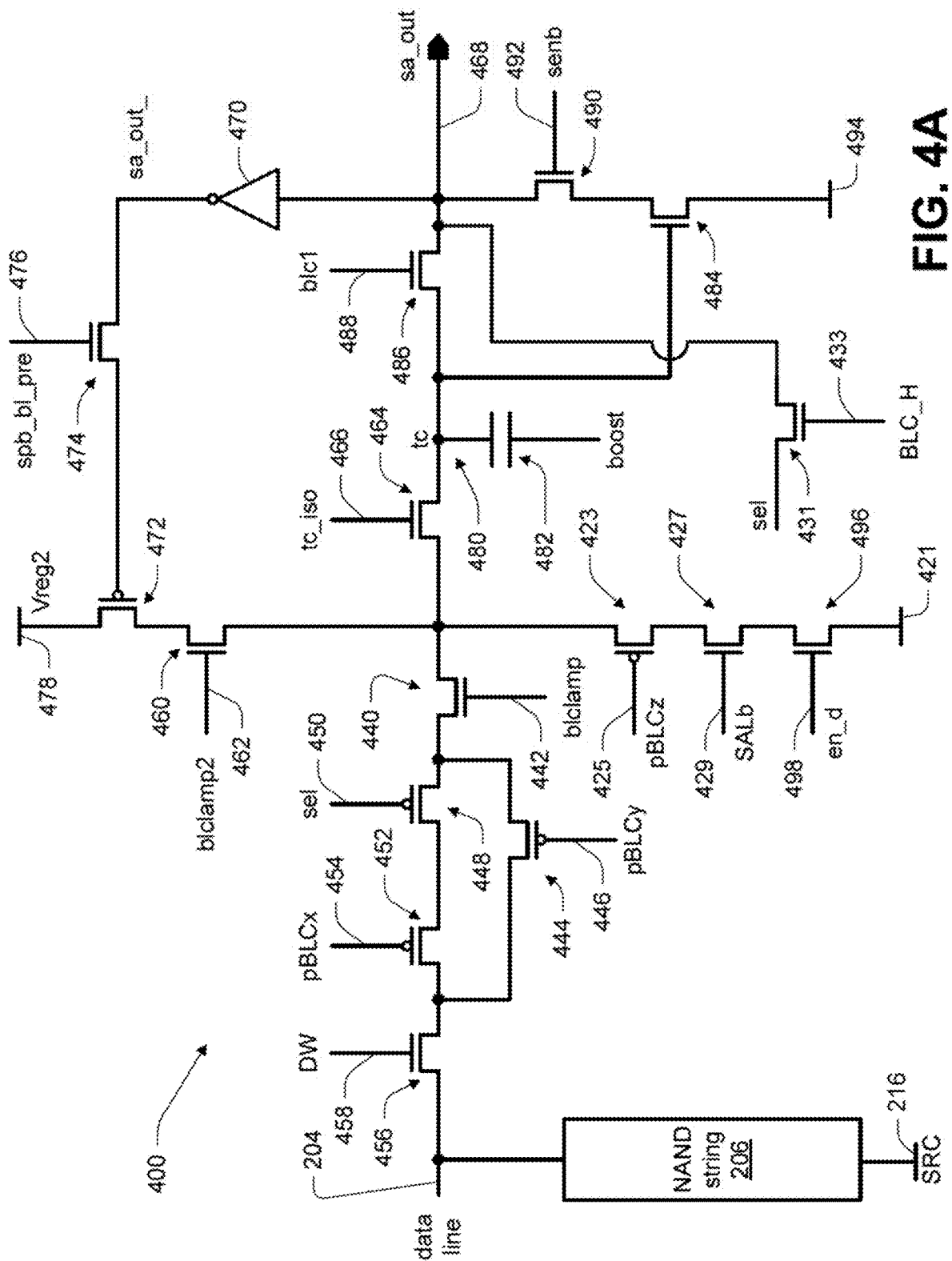
FIGS. 4A-4B are schematics of a sensing device of a type that might be used with various embodiments.

Sensing devices are typically utilized in memory devices to facilitate performing a sense (e.g., read and/or verify) operation on each of one or more selected (e.g., target) memory cells in the memory device. A sense operation might be a read operation, e.g., for providing data output from the array of memory cells, or a verify operation, e.g., for verifying whether a programming pulse successfully changed a threshold voltage of a target memory cell to indicate its desired data state. FIG. 4A illustrates a sensing device 400 of a type that might be used with various embodiments. Sensing device 400 is shown connected to a particular NAND string 206 by a particular data line 204, such as shown in more detail in FIG. 2A, for example. Note that select transistors 210 and 212 selectively connecting the NAND string 206 to the source 216 and data line 204, respectively, are not shown in FIG. 4A. While the discussion is directed to use of the sensing device 400 with a NAND string 206, other memory structures and architectures are suitable for use with sensing device 400 where a current path can be selectively created between the source 216 and the data line 204 dependent upon a data state of a memory cell selected for sensing.

As part of a sense operation, e.g., a setup portion of the sense operation, the sensing device 400 may precharge the data line 204 by activating a first clamp transistor (e.g., n-type field effect transistor, or nFET) 440 by biasing the signal line 442 to a particular voltage level (e.g., a voltage level of control signal blclamp) sufficient to activate the transistor 440, by activating at least one of a first current path including the transistor (e.g., p-type field-effect transistor, or pFET) 444 by biasing the signal line 446 to a particular voltage level (e.g., a voltage level of control signal pBLCy) sufficient to activate the transistor 444 or a second current path including the transistors (pFETs) 448 and 452 by biasing the signal lines 450 and 454, respectively, to particular voltage levels (e.g., voltage levels of control signals sel and pBLCx, respectively) sufficient to activate the transistors 448 and 452, respectively, by activating a transistor (e.g., nFET) 456 by biasing the signal line 458 to a particular voltage level (e.g., a voltage level of control signal DW) sufficient to activate the transistor 456, by activating a second clamp transistor (e.g., nFET) 460 by biasing the signal line 462 to a particular voltage level (e.g., a voltage level of control signal blclamp2) sufficient to activate the transistor 460, and by deactivating an isolation transistor (e.g., nFET) 464 by biasing the signal line 466 to a particular voltage level (e.g., a voltage level of control signal tc_iso) sufficient to deactivate the transistor 464. Control signals of the sensing device 400 may be provided by the internal controller (e.g., control logic 116) of the memory device 100.

Such control signals (e.g., both voltage levels and timing) may be defined by the sense operation and are distinguished from signals generated in response to performing the sense operation (e.g., the voltage level generated at the output 468 of the sensing device 400 (e.g., the output signal sa_out), or a voltage level generated on the tc node 464). The output 468 might have an initial logic high level, and might be connected to the input of an inverter 470, such that a transistor 472 (e.g., pFET), having its control gate selectively connected to the output of the inverter 470 through transistor (e.g., nFET) 474, might be activated when the transistor 474 is activated by biasing the signal line 476 to a particular voltage level (e.g., a voltage level of control signal spb_bl_pre) sufficient to activate the transistor 474. This might connect the data line 204 to the voltage node 478 configured to receive a voltage level Vreg2, which might be a regulated version of the supply voltage Vcc.

The tc node 480 might be connected to one electrode of a capacitance (e.g., capacitor) 482, to the control gate of a transistor (e.g., nFET) 484, and to a source/drain of a transistor (e.g., nFET) 486 having its control gate connected to signal line 488 configured to receive the control signal blc1. The transistor 486 might remain deactivated during the sense operation. The capacitance 482 might have its second electrode connected to receive the control signal boost. Although the capacitance 482 is depicted in FIG. 4A as a capacitor, it should be recognized that, in other examples, capacitance 482 can refer to a portion (which may include one or more active/passive elements) of a circuit (e.g., sensing device) having a capacitance (e.g., a predefined capacitance) and configured to store charge from the tc node 480.

A sense enable transistor (e.g., nFET) 490 might be connected between a source/drain of the transistor 484 and the output 468 of the sensing device 400, and might have its control gate connected to the signal line 492 configured to receive the control signal senb. The transistor 484 might have its other source/drain connected to a voltage node 494. The voltage node 494 might be configured to receive a variable voltage level.

Following the precharging of the data line 204, additional portions of the sense operation might be performed to detect whether or not the selected memory cell of the NAND string 206 is activated during the sense operation, thereby determining the data state of the memory cell selected for sensing. In general, following the precharging of the data line 204, or concurrently with precharging, the data line 204 can be selectively connected to the source 216 depending upon whether the memory cell selected for sensing is activated or deactivated in response to a sense voltage applied to its control gate. The data line 204 might further be connected to the voltage node 421 while remaining isolated from the tc node 480. Connection of the data line 204 to the voltage node 421 might include activating the transistors 456, 444, 440, 423 (e.g., in response to the control signal pBLCz on signal line 425), 427 (e.g., in response to the signal SALb on signal line 429), and 496 (e.g., in response to the control signal en_d on signal line 498). The control signal pBLCy might have some value, e.g., positive, neutral or negative, to limit discharge of the data line 204 through the transistor 444 to a first positive voltage level, e.g., relative to the source 216. Connection of the data line 204 to the voltage node 421 might further include activating the transistors 452 and 450. The control signal pBLCx might have some value, e.g., positive, neutral or negative, to limit discharge of the data line 204 through the transistor 452 to a second positive voltage level, e.g., relative to the source 216, lower than the first positive voltage level. With this configuration, the control signal sel on signal line 450 can select whether the data line 204 is limited to the first positive voltage level or the second positive voltage level during discharge, although other methods of limiting discharge are suitable. Selection might be based on the data state to be sensed during a concurrent sensing. For example, for two adjacent data states to be sensed concurrently, the lower of the two data states might limit discharge of its data line to the second positive voltage level, and the higher of the two data states might limit discharge of its data line to the first positive voltage level. For some embodiments, a transistor (e.g., nFET) 431 might have a first source/drain connected to the output 468, and a second source/drain selectively generating the control signal sel in response to a control signal BLC_H received on signal line 433.

If the memory cell selected for sensing is deactivated, the data line 204 might be allowed to discharge to the first or second positive voltage level as discussed above. If the memory cell is at least partially activated, a steady-state voltage level might develop on the data line that is higher than the first positive voltage level. Higher levels of activation, and thus higher levels of current flow, might lead to higher steady-state voltage levels.

The data line 204 might then be isolated from the voltage node 421 and connected to the tc node 480. Isolation of the data line from the voltage node 421 might include deactivation of one or more of the transistors 423, 427 and/or 496.

Connection of the data line to the tc node 480 might include activation of the transistor 464. At this point, current flow through the memory cell can begin to charge the tc node 480 and the capacitance 482. The data line 204 might remain connected to the tc node 480 for a development time, such that a memory cell generating a current flow indicative of a threshold voltage that is below a desired threshold voltage of that memory cell would develop a voltage level on the tc node 480 sufficient to activate the transistor 484. Note that the voltage node 494 might be configured to receive a variable voltage level, allowing for control of the activation voltage level of the transistor 484. This might be used in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. Control of the activation voltage level of the transistor 484 can provide information during a signal verify operation as to whether a memory cell failing the verify operation should be partially or fully enabled for programming during a next subsequent programming pulse.

With the transistor 490 activated, and the voltage level of the tc node 480 applied to the control gate of the transistor 484, the voltage node 494 may be selectively connected to the output 468 depending upon a voltage level of the tc node 480. The output 468 may have a particular logic level (e.g., logic high) prior to sensing. If the voltage level of the voltage node 494 is applied to the output 468 upon activation of the transistor 490, its logic level may change, e.g., from a logic high level to a logic low level, and if the voltage node 494 remains isolated from the output 468 upon activation of the transistor 490, its logic level may remain at the particular logic level.

Figure 4B:
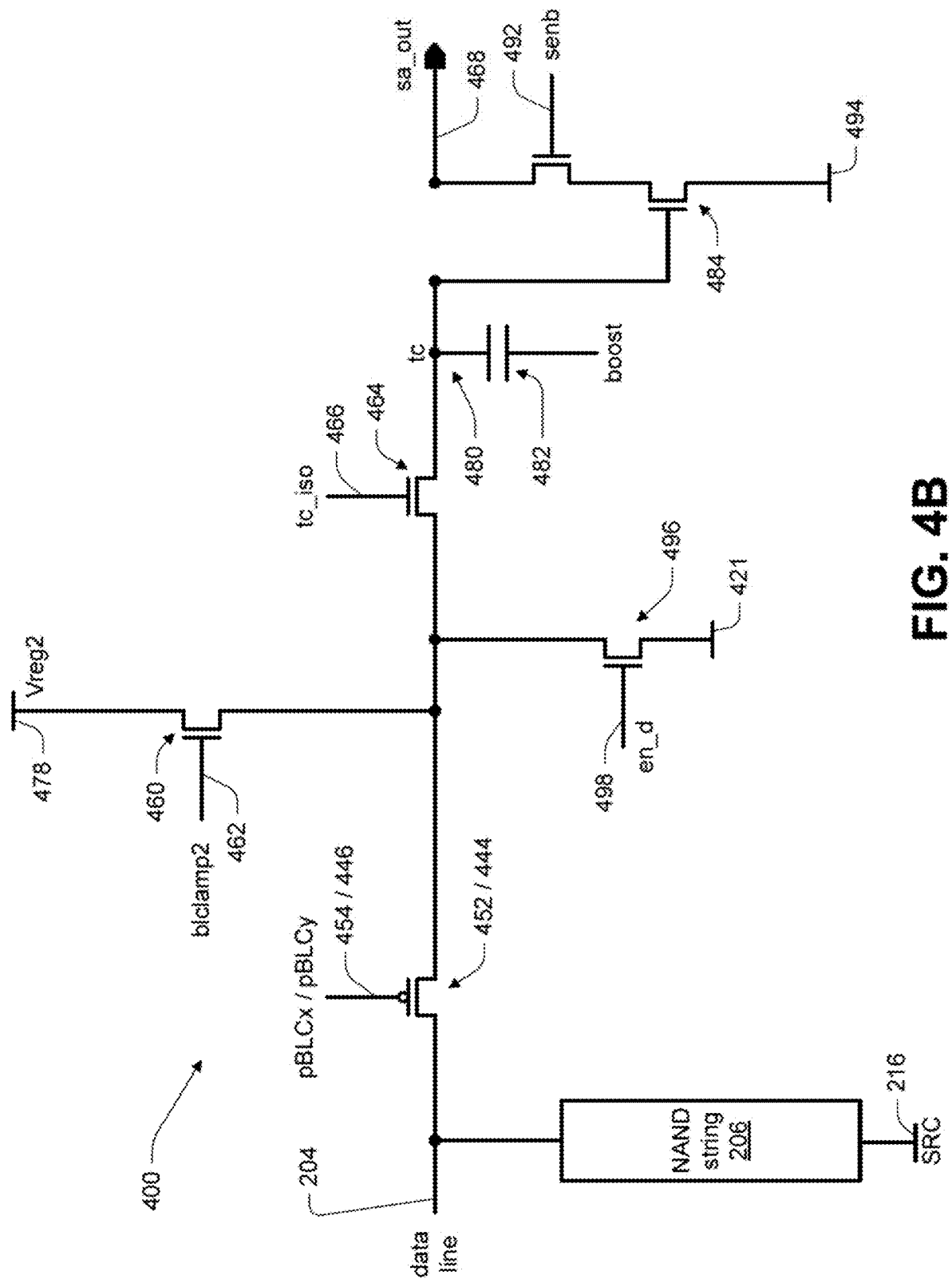

FIG. 4B illustrates a simplified version of the sensing device 400. Like numbered elements in FIG. 4B correspond to the description as provided with respect to FIG. 4A. FIG. 4B depicts active nodes of a sense operation discussed with reference to FIG. 5.

Figure 5:
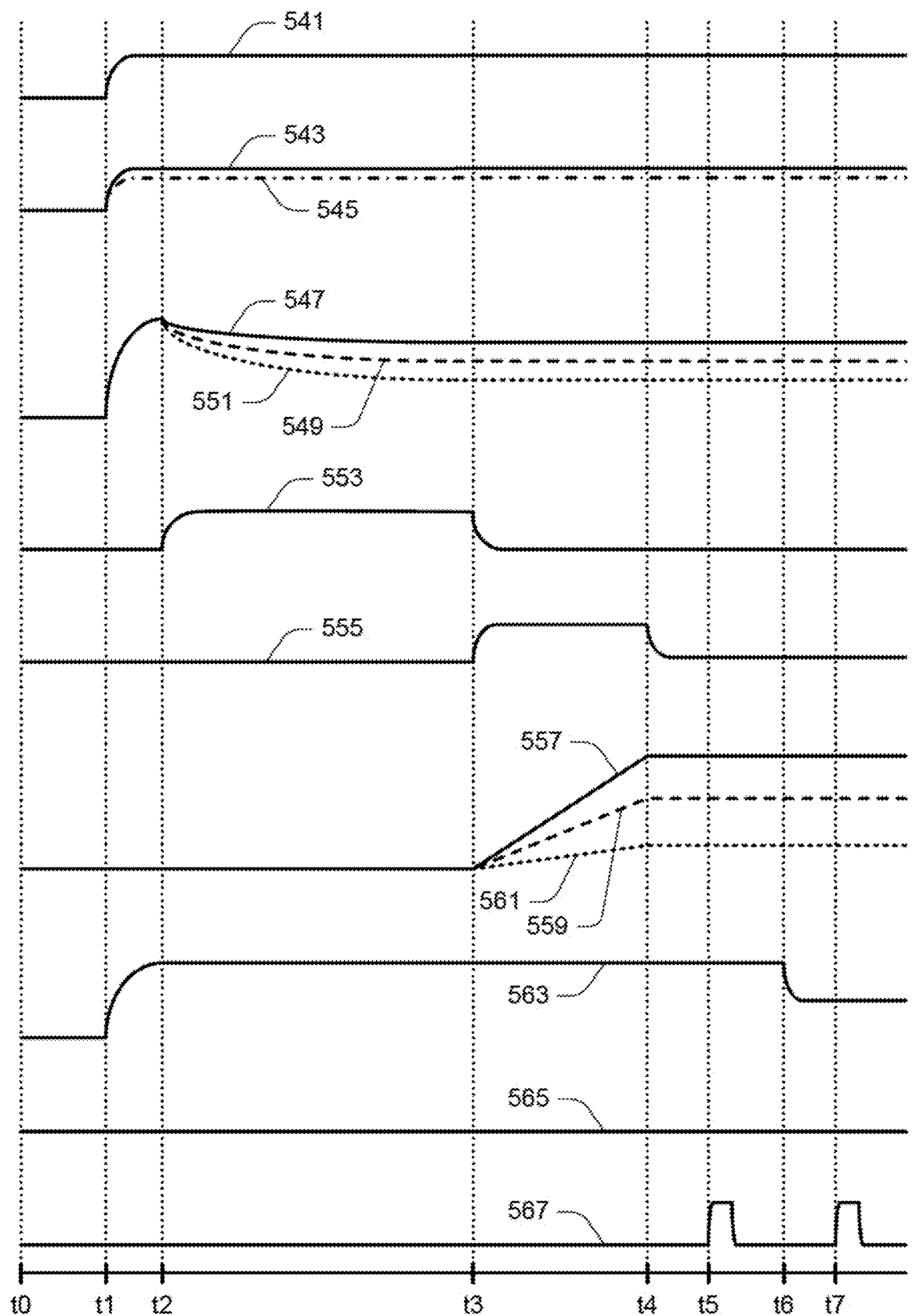
FIG. 5 is a timing diagram generally depicting voltage levels of various nodes and control signal of a sensing device such as depicted in FIG. 4B at various stages of a sense operation in accordance with an embodiment.

FIG. 5 depicts a timing diagram of voltage levels of control signals and nodes a sensing device, such as the sensing device 400 of FIG. 4B. Trace 541 might represent a voltage level of the control signal blclamp2 on signal line 462, trace 543 might represent a voltage level of the control signal pBLCy on signal line 446, trace 545 might represent a voltage level of the control signal pBLCx on signal line 454. Trace 547 might represent a voltage level of a data line 204 for a memory cell having a high current flow, trace 549 might represent a voltage level of a data line 204 for a memory cell having a medium current flow, and trace 551 might represent a voltage level of a data line 204 for a memory cell having a low current flow. Trace 553 might represent a voltage level of the control signal en_d on signal line 498 and trace 555 might represent a voltage level of the control signal tc_iso on signal line 466. Trace 557 might represent a voltage level of the tc node 480 in response to a high-current memory cell, trace 559 might represent a voltage level of the tc node 480 in response to a medium-current memory cell, and trace 561 might represent a voltage level of the tc node 480 in response to a low-current memory cell. Trace 563 might represent a voltage level of the voltage node 494 and trace 565 might represent a voltage level of the control signal boost. Trace 567 might represent a voltage level of the control signal senb on signal line 492.

At time t0, each of the traces might be at a reference potential, e.g., Vss, ground or 0V. At time t1, the data line might be connected to the voltage node 478, e.g., including increasing the control signal blclamp2 of trace 541 to a voltage level sufficient to activate the transistor 460. The control signal pBLCy of trace 543 or the control signal pBLCx of trace 545 might be increased to a positive voltage level sufficient to place the transistor 444 or 452, respectively, in a cut-off state if the voltage level of the data line discharges to the first positive voltage level or the second positive voltage level, respectfully. The voltage level of the data line of trace 547, 549 or 551 might approach the voltage level of the voltage node 478. The voltage level of the voltage node 494 of the trace 563 might increase to a first voltage level, e.g., 0.75V.

At time t2, the data line might be connected to the voltage node 421, e.g., including increasing the control signal en_d of trace 553 to a voltage level sufficient to activate the transistor 496. As a result, the voltage level of the data line might begin to discharge toward a steady-state voltage level of trace 547, 549 or 551, depending upon the activation level of its selected memory cell.

At time t3, the data line might be isolated from the voltage node 421, e.g., including decreasing the control signal en_d of trace 553 to a voltage level sufficient to deactivate the transistor 496, and might be connected to the tc node 480, e.g., including increasing the control signal tc_iso of trace 555 to a voltage level sufficient to activate the transistor 464. As a result, the voltage level of the tc node 480 might begin to increase in response to a current flow through its selected memory cell.

At time t4, the data line might again be isolated from the tc node 480, e.g., including decreasing the control signal tc_iso of trace 555 to a voltage level sufficient to deactivate the transistor 464. At time t5, the control signal senb of trace 567 might be strobed while the voltage node 494 has its first voltage level. Activation of the transistor 484 under these conditions might indicate a memory cell far below its intended threshold voltage. At time t6, the voltage level of the voltage node 494 of the trace 563 might decrease to a second voltage level, e.g., 0.25V. At time t7, the control signal senb of trace 567 might be strobed while the voltage node 494 has its second voltage level. Activation of the transistor 484 under these conditions might indicate a memory cell below, but nearer, its intended threshold voltage. Deactivation of the transistor 484 under these conditions might indicate that the memory cell has reached its intended threshold voltage.

Figure 6A:
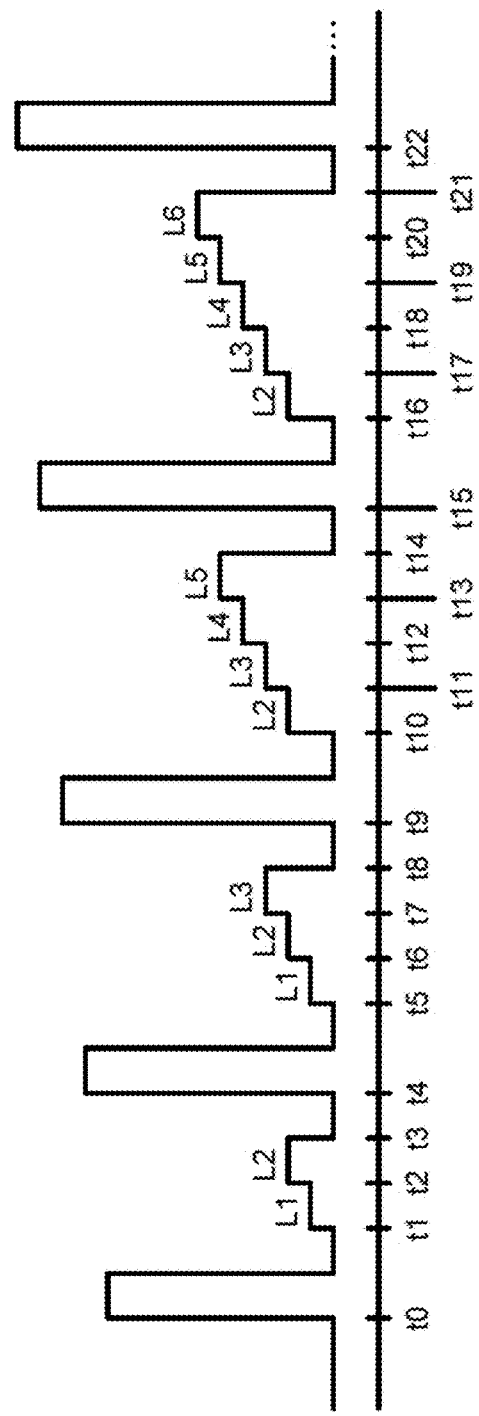
FIG. 6A conceptually depicts a programming operation without concurrent sensing of data states.
Figure 6B:
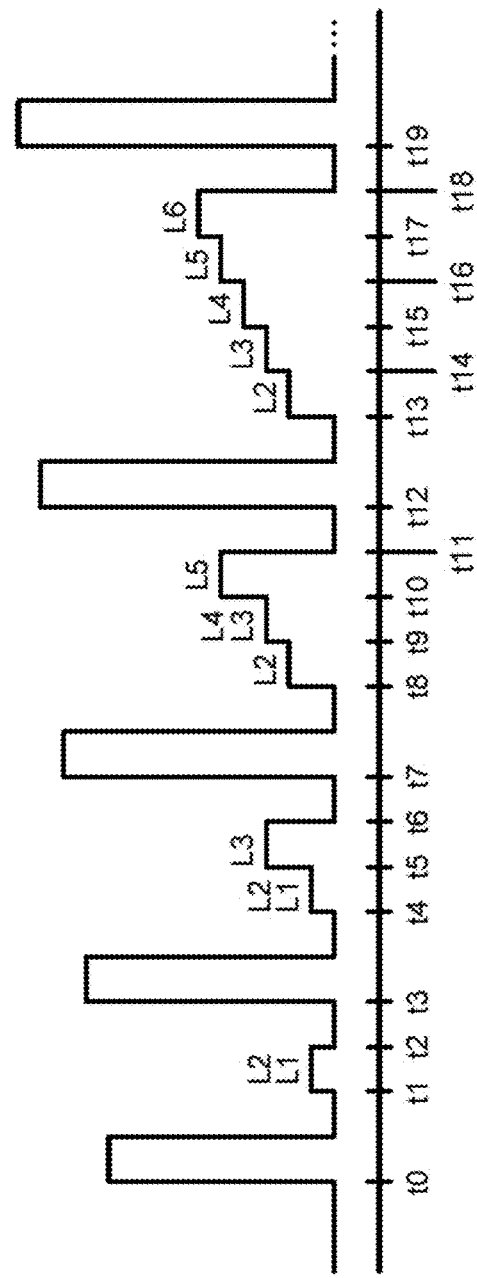
FIG. 6B conceptually depicts a programming operation with concurrent sensing of data states in accordance with an embodiment.

In addition to mitigating widening of threshold voltage distributions over verify operations relying only upon variation of Vds voltage differentials for concurrent sensing, various embodiments further facilitate improved programming times. FIG. 6A conceptually depicts a programming operation without concurrent sensing of data states, while FIG. 6B conceptually depicts a programming operation with concurrent sensing of data states in accordance with an embodiment. FIGS. 6A and 6B generally depict voltage levels applied to a selected access line of a programming operation.

In FIG. 6A, at time t0, a programming pulse might be applied to the selected access line. At time t1, a first verify voltage level might be applied and the states of the tc nodes might be sensed for the data state L1, e.g., the control signals senb might be strobed for each sensing device. At time t2, a second verify voltage level might be applied and the states of the tc nodes might be sensed for the data state L2. Remaining data states might not be evaluated as the voltage level of the preceding programming pulse might be deemed insufficient to program memory cells of higher data states.

At time t4, a subsequent programming pulse might be applied to the selected access line. It is noted that the subsequent programming pulse need not be an immediately subsequent programming pulse, and that additional programming pulses and additional verify voltage levels might be applied between time t3 and time t4. At time t5, the first verify voltage level might be applied and the states of the tc nodes might be sensed for the data state L1. At time t6, the second verify voltage level might be applied and the states of the tc nodes might be sensed for the data state L2. At time t7, a third verify voltage level might be applied and the states of the tc nodes might be sensed for the data state L3. Remaining data states might not be evaluated as the voltage level of the preceding programming pulse might be deemed insufficient to program memory cells of higher data states.

At time t9, a subsequent programming pulse might be applied to the selected access line. It is noted that the subsequent programming pulse need not be an immediately subsequent programming pulse, and that additional programming pulses and additional verify voltage levels might be applied between time t8 and time t9. At time t10, the second verify voltage level might be applied and the states of the tc nodes might be sensed for the data state L2. The first verify voltage might not be applied as it might have been determined that all memory cells intended for the data state L1 have reached their intended threshold voltage. At time t11, the third verify voltage level might be applied and the states of the tc nodes might be sensed for the data state L3. At time t12, a fourth verify voltage level might be applied and the states of the tc nodes might be sensed for the data state L4. At time t14, a fifth verify voltage level might be applied and the states of the tc nodes might be sensed for the data state L5. Remaining data states might not be evaluated as the voltage level of the preceding programming pulse might be deemed insufficient to program memory cells of higher data states.

At time t15, a subsequent programming pulse might be applied to the selected access line. It is noted that the subsequent programming pulse need not be an immediately subsequent programming pulse, and that additional programming pulses and additional verify voltage levels might be applied between time t14 and time t15. At time t16, the second verify voltage level might be applied and the states of the tc nodes might be sensed for the data state L2. The first verify voltage might not be applied as it might have been determined that all memory cells intended for the data state L1 have reached their intended threshold voltage. At time t17, the third verify voltage level might be applied and the states of the tc nodes might be sensed for the data state L3. At time t18, the fourth verify voltage level might be applied and the states of the tc nodes might be sensed for the data state L4. At time t19, the fifth verify voltage level might be applied and the states of the tc nodes might be sensed for the data state L5. At time t20, a sixth verify voltage level might be applied and the states of the tc nodes might be sensed for the data state L6. Remaining data states might not be evaluated as the voltage level of the preceding programming pulse might be deemed insufficient to program memory cells of higher data states. At time t22, a subsequent programming pulse might be applied to the selected access line, and the programming operation might continue until completion.

In FIG. 6B, at time t0, a programming pulse might be applied to the selected access line. At time t1, a first verify voltage level might be applied and the states of the tc nodes might be sensed, e.g., concurrently sensed, for either the data state L1 or the data state L2. Remaining data states might not be evaluated as the voltage level of the preceding programming pulse might be deemed insufficient to program memory cells of higher data states.

At time t3, a subsequent programming pulse might be applied to the selected access line. It is noted that the subsequent programming pulse need not be an immediately subsequent programming pulse, and that additional programming pulses and additional verify voltage levels might be applied between time t2 and time t3. At time t4, the first verify voltage level might be applied and the states of the tc nodes might be sensed, e.g., concurrently sensed, for either the data state L1 or the data state L2. At time t5, a third verify voltage level might be applied and the states of the tc nodes might be sensed for the data state L3. Remaining data states might not be evaluated as the voltage level of the preceding programming pulse might be deemed insufficient to program memory cells of higher data states.

At time t7, a subsequent programming pulse might be applied to the selected access line. It is noted that the subsequent programming pulse need not be an immediately subsequent programming pulse, and that additional programming pulses and additional verify voltage levels might be applied between time t6 and time t7. At time t8, a second verify voltage level might be applied and the states of the tc nodes might be sensed for the data state L2. The first verify voltage might not be applied as it might have been determined that all memory cells intended for the data state L1 have reached their intended threshold voltage. At time t9, the third verify voltage level might be applied and the states of the tc nodes might be sensed, e.g., concurrently sensed, for either the data state L3 or the data state L4. At time t10, a fifth verify voltage level might be applied and the states of the tc nodes might be sensed for the data state L5. Remaining data states might not be evaluated as the voltage level of the preceding programming pulse might be deemed insufficient to program memory cells of higher data states.

At time t12, a subsequent programming pulse might be applied to the selected access line. It is noted that the subsequent programming pulse need not be an immediately subsequent programming pulse, and that additional programming pulses and additional verify voltage levels might be applied between time t11 and time t12. At time t13, the second verify voltage level might be applied and the states of the tc nodes might be sensed for the data state L2. The first verify voltage might not be applied as it might have been determined that all memory cells intended for the data state L1 have reached their intended threshold voltage. At time t14, the third verify voltage level might be applied and the states of the tc nodes might be sensed for the data state L3. At time t15, a fourth verify voltage level might be applied and the states of the tc nodes might be sensed for the data state L4. At time t16, the fifth verify voltage level might be applied and the states of the tc nodes might be sensed for the data state L5. At time t17, a sixth verify voltage level might be applied and the states of the tc nodes might be sensed for the data state L6. Remaining data states might not be evaluated as the voltage level of the preceding programming pulse might be deemed insufficient to program memory cells of higher data states. At time t19, a subsequent programming pulse might be applied to the selected access line, and the programming operation might continue until completion. As can be seen in a comparison of FIG. 6A to 6B, use of concurrent sensing can reduce programming time by reducing the time required for verify operations of the various data states.

Figure 7:
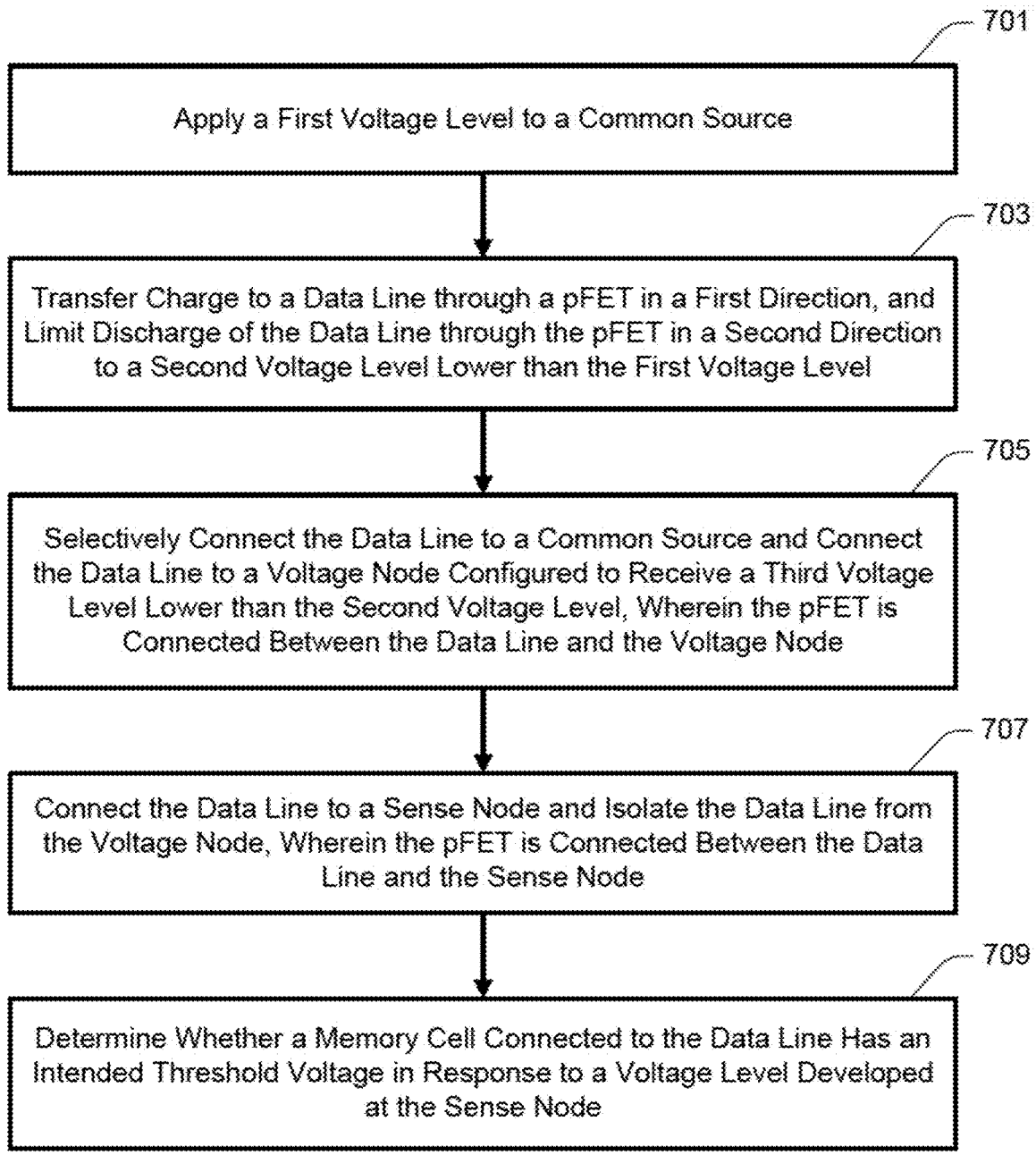
FIG. 7 depicts a flowchart of a method of operating a memory according to an embodiment.

FIG. 7 depicts a flowchart of a method of operating a memory according to an embodiment, e.g., during a sense operation in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 701, a first voltage level might be applied to a common source. For example, a supply voltage level Vcc, a regulated version of the supply voltage level Vcc, or a generated voltage level (e.g., positive voltage level) might be applied to the source 216.

At 703, charge might be transferred to a data line through a p-type field-effect transistor (pFET) in a first direction, and discharge of the data line through the pFET might be limited in a second direction to a second voltage level lower than the first voltage level. For example, charge might be transferred to a data line 204 from a voltage node 478 through a pFET 444 and/or a pFET 452. The voltage node 478 might have a voltage level similar to, and in some cases equal to, the first voltage level. Discharge of the data line 204 through the pFET 444 and/or pFET 452 might be limited by applying respective voltage levels to their control gates configured to place the pFETs in a cut-off state when the data line 204, acting as a source of the pFET, has some positive voltage level. Data lines connected to memory cells of different intended data states might have different limits on their discharge. For example, for memory cells having one data state, their data lines might have their discharge limited to one voltage level through a pFET 444 without a current path through a pFET 452, while for memory cells having a different, lower, data state, their data lines might have their discharge limited to a lower voltage through a pFET 452, and may have a current path through a pFET 444.

At 705, the data line might be selectively connected to the common source, e.g., through a memory cell selected for sensing, and might further be connected to a voltage node configured to receive a third voltage level lower than the second voltage level. The pFET might be connected between the data line and the voltage node. For example, a data line 204 might be connected to a voltage node 421 through the pFET 444 and/or the pFET 452. The voltage node 421 might be configured to receive a reference potential, such as the supply voltage Vss, ground or 0V.

At 707, the data line might be connected to a sense node, e.g., of a sensing device, and isolated from the voltage node. The pFET might be connected between the data line and the sense node. For example, a data line 204 might be connected to a sense node 480 of a sensing device 400 through the pFET 444 and/or the pFET 452. The data line 204 might further be isolated from the voltage node 421. The data line might be connected to the sense node concurrently with isolating the data line from the voltage node.

At 709, in response to a voltage level developed at the sense node, it might be determined whether a memory cell connected to the data line has an intended threshold voltage. For example, if the voltage level of the sense node 480 reaches a level sufficient to activate the transistor 484 of the sensing device 400, the memory cell selected for sensing might be deemed to have a threshold voltage lower than its intended threshold voltage. If the voltage level of the sense node 480 fails to reach a level sufficient to activate the transistor 484 of the sensing device 400, the memory cell selected for sensing might be deemed to have a threshold voltage level greater than, or equal to, its intended threshold voltage.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A sensing device, comprising:
   a first voltage node configured to receive a first voltage level;
   a second voltage node configured to receive a second voltage level lower than the first voltage level;
   a p-type field-effect transistor (pFET) selectively connected to a data line, selectively connected to the first voltage node without being connected to the second voltage node, and selectively connected to the second voltage node without being connected to the first voltage node, wherein the pFET is connected between the first voltage node and the data line, and is connected between the second voltage node and the data line; and
   a sense node selectively connected to the pFET, wherein the pFET is connected between the sense node and the data line.

2. The sensing device of claim 1, wherein the sense node is connected to a capacitance.

3. The sensing device of claim 2, wherein the capacitance comprises a capacitor.

4. The sensing device of claim 1, wherein the pFET is a first pFET, the sensing device further comprising:
   a second pFET connected between the sense node and the first pFET, connected between the first voltage node and the first pFET, and connected between the second voltage node and the first pFET.

5. The sensing device of claim 1, wherein the first voltage level is a positive voltage level.

6. The sensing device of claim 5, wherein the second voltage level is a reference potential.

7. A sensing device, comprising:
   a first voltage node configured to receive a first voltage level;
   a second voltage node configured to receive a second voltage level lower than the first voltage level;
   a first p-type field-effect transistor (first pFET) selectively connected to a data line, wherein the first pFET is connected between the first voltage node and the data line, and is connected between the second voltage node and the data line; and
   a sense node selectively connected to the first pFET;
   a second pFET connected between the sense node and the first pFET, connected between the first voltage node and the first pFET, and connected between the second voltage node and the first pFET; and
   a third pFET connected in parallel with the first pFET and the second pFET.

8. The sensing device of claim 7, wherein a control gate of the first pFET is configured to receive a voltage level lower than a voltage level a control gate of the third pFET is configured to receive.

9. A memory, comprising:
   an array of memory cells comprising a plurality of strings of series-connected memory cells;
   a plurality of data lines, wherein each data line of the plurality of data lines is selectively connected to a respective set of strings of series-connected memory cells of the plurality of strings of series-connected memory cells;
a common source selectively connected to each string of series-connected memory cells of the plurality of strings of series-connected memory cells;
a sensing device selectively connected to a particular data line of the plurality of data lines; and
a controller for access of the array of memory cells, wherein the controller is configured to cause the memory to:
apply a first voltage level to the common source;
transfer charge to the particular data line through a p-type field-effect transistor (pFET) in a first direction, and limit discharge of the particular data line through the pFET in a second direction to a second voltage level lower than the first voltage level;
selectively connect the particular data line to the common source and connect the particular data line to a voltage node configured to receive a third voltage level lower than the second voltage level;
connect the particular data line to a sense node of the sensing device and isolate the particular data line from the voltage node, wherein the pFET is connected between the particular data line and the sense node; and
determine whether a memory cell connected to the particular data line has an intended threshold voltage in response to a voltage level developed at the sense node.

10. The memory of claim 9, wherein the controller being configured to cause the memory to connect the particular data line to the voltage node comprises the controller being configured to cause the memory to connect the particular data line to the voltage node until a steady-state voltage level is developed on the particular data line in response to current flow from the common source through the memory cell connected to the particular data line and through the pFET to the voltage node.

11. The memory of claim 10, wherein the controller being configured to cause the memory to connect the particular data line to the sense node and isolate the particular data line from the voltage node comprises the controller being configured to cause the memory to concurrently connect the particular data line to the sense node and isolate the particular data line from the voltage node.

12. The memory of claim 9, wherein the first voltage level is a positive voltage level.

13. The memory of claim 12, wherein the first voltage level is selected from a group consisting of a supply voltage of the memory and a regulated version of the supply voltage.

14. The memory of claim 12, wherein the second voltage level is a reference potential.

15. The memory of claim 14, wherein the second voltage level is a supply voltage of the memory.

16. The memory of claim 9, wherein the sensing device is a first sensing device, wherein the pFET is a first pFET, and wherein the memory further comprises:
a second sensing device selectively connected to a different data line of the plurality of data lines;
wherein the controller is further configured to cause the memory to:
transfer charge to the different data line through a second pFET in the first direction, and limit discharge of the particular data line through the second pFET in the second direction to a fourth voltage level lower than the first voltage level and different than the second voltage level;
selectively connect the different data line to the common source and connect the different data line to the voltage node configured to receive the third voltage level;
connect the different data line to a sense node of the second sensing device and isolate the different data line from the voltage node, wherein the second pFET is connected between the different data line and the sense node of the second sensing device; and
determine whether a memory cell connected to the different data line has an intended threshold voltage, for the memory cell connected to the different data line, in response to a voltage level developed at the sense node of the second sensing device.

17. The memory of claim 16, wherein the intended threshold voltage for the memory cell connected to the particular data line corresponds to a particular data state of a plurality of data states, and wherein the intended threshold voltage for the memory cell connected to the different data line corresponds to a different data state of the plurality of data states.

18. The memory of claim 17, wherein the particular data state and the different data state are adjacent data states of the plurality of data states.

19. The memory of claim 18, wherein the controller being configured to cause the memory to determine whether the memory cell connected to the different data line has the intended threshold voltage for the memory cell connected to the different data line comprises the controller being configured to cause the memory to determine whether the memory cell connected to the different data line has the intended threshold voltage for the memory cell connected to the different data line concurrently with causing the memory to determine whether the memory cell connected to the particular data line has the intended threshold voltage for the memory cell connected to the particular data line.

20. The memory of claim 16, wherein the first pFET is configured to receive a fifth voltage level at a control gate of the first pFET, and wherein the second pFET is configured to receive a sixth voltage level different than the fifth voltage level at a control gate of the second pFET.

21. The memory of claim 20, wherein the fifth voltage level and the sixth voltage level are each positive voltage levels.

22. A memory, comprising:
an array of memory cells comprising a plurality of strings of series-connected memory cells;
a plurality of data lines, wherein each data line of the plurality of data lines is selectively connected to a respective set of strings of series-connected memory cells of the plurality of strings of series-connected memory cells;
a common source selectively connected to each string of series-connected memory cells of the plurality of strings of series-connected memory cells; and
a sensing device selectively connected to a particular data line of the plurality of data lines, wherein the sensing device comprises:
a first voltage node configured to receive a first voltage level;
a second voltage node configured to receive a second voltage level lower than the first voltage level;
a p-type field-effect transistor (pFET) selectively connected to a data line, selectively connected to the first voltage node without being connected to the second voltage node, and selectively connected to the second voltage node without being connected to the first voltage node, wherein the pFET is connected between the first voltage node and the data line, and is connected between the second voltage node and the data line; and a sense node selectively connected to the pFET, wherein the pFET is connected between the sense node and the data line.

23. The memory of claim 22, wherein the sense node of the sensing device is connected to a capacitor.

24. The memory of claim 22, wherein the pFET is a first pFET, and wherein the sensing device further comprises:
a second pFET connected between the sense node and the first pFET, connected between the first voltage node and the first pFET, and connected between the second voltage node and the first pFET.

25. A memory, comprising:
an array of memory cells comprising a plurality of strings of series-connected memory cells;
a plurality of data lines, wherein each data line of the plurality of data lines is selectively connected to a respective set of strings of series-connected memory cells of the plurality of strings of series-connected memory cells;
a common source selectively connected to each string of series-connected memory cells of the plurality of strings of series-connected memory cells; and
a sensing device selectively connected to a particular data line of the plurality of data lines, wherein the sensing device comprises:
a first voltage node configured to receive a first voltage level;
a second voltage node configured to receive a second voltage level lower than the first voltage level;
a first p-type field-effect transistor (first pFET) selectively connected to a data line, wherein the first pFET is connected between the first voltage node and the data line, and is connected between the second voltage node and the data line; and
a sense node selectively connected to the first pFET;
a second pFET connected between the sense node and the first pFET, connected between the first voltage node and the first pFET, and connected between the second voltage node and the first pFET; and
a third pFET connected in parallel with the first pFET and the second pFET.

26. The memory of claim 25, wherein a control gate of the first pFET is configured to receive a voltage level lower than a voltage level a control gate of the third pFET is configured to receive.

* * * * *